(12) United States Patent
Sakamoto et al.

(10) Patent No.: US 9,985,240 B2
(45) Date of Patent: May 29, 2018

(54) SEALING MATERIAL AND SEALING METHOD USING THE SAME

(71) Applicant: Nippon Electric Glass Co., Ltd., Shiga (JP)

(72) Inventors: Akihiko Sakamoto, Shiga (JP); Masanori Wada, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 351 days.

(21) Appl. No.: 14/609,934

(22) Filed: Jan. 30, 2015

(65) Prior Publication Data

US 2015/0140238 A1    May 21, 2015

Related U.S. Application Data

(62) Division of application No. 13/022,831, filed on Feb. 8, 2011.

(30) Foreign Application Priority Data

Feb. 10, 2010  (JP) ................. 2010-028049
Jun. 30, 2010  (JP) ................. 2010-148657
Jan. 18, 2011  (JP) ................. 2011-007661

(51) Int. Cl.
*H01L 51/52*  (2006.01)
*C03B 37/025*  (2006.01)
*H05B 33/04*  (2006.01)
*H01L 31/048*  (2014.01)
*H01L 51/44*  (2006.01)

(52) U.S. Cl.
CPC ........ *H01L 51/5237* (2013.01); *C03B 37/025* (2013.01); *H01L 31/0481* (2013.01); *H01L 31/0488* (2013.01); *H01L 51/524* (2013.01); *H05B 33/04* (2013.01); *H01L 51/448* (2013.01); *H01L 51/5246* (2013.01); *Y02E 10/50* (2013.01); *Y02P 40/57* (2015.11); *Y10T 428/24479* (2015.01)

(58) Field of Classification Search
CPC . C03B 37/025; H01L 31/0488; H01L 51/448; H01L 51/5237; H01L 51/524; H01L 51/5246; H05B 33/04; Y02P 40/57; Y10T 428/24479
USPC .......................... 428/426, 428, 688
See application file for complete search history.

(56) References Cited

U.S. PATENT DOCUMENTS

| | | | |
|---|---|---|---|
| 3,709,673 A | 1/1973 | Bishop | |
| 4,130,680 A * | 12/1978 | Ference | C03B 17/02 |
| | | | 156/100 |
| 6,111,357 A | 8/2000 | Fleming et al. | |
| 6,482,524 B1 | 11/2002 | Yamamoto et al. | |
| 2006/0021385 A1 | 2/2006 | Cimo et al. | |
| 2007/0284761 A1 | 12/2007 | Morooka et al. | |
| 2008/0202167 A1 | 8/2008 | Cavallaro et al. | |
| 2008/0239637 A1 | 10/2008 | Sung et al. | |
| 2008/0302418 A1 | 12/2008 | Buller et al. | |
| 2009/0206738 A1 | 8/2009 | Koo et al. | |
| 2009/0314032 A1 | 12/2009 | Tomamoto et al. | |
| 2010/0132785 A1 | 6/2010 | Morooka et al. | |
| 2013/0048967 A1 * | 2/2013 | Nishido | H05B 33/04 |
| | | | 257/40 |

FOREIGN PATENT DOCUMENTS

| | | |
|---|---|---|
| EP | 2 077 254 | 7/2009 |
| EP | 2 221 909 | 8/2010 |
| JP | 52-152410 | 12/1977 |
| JP | 58-104047 | 6/1983 |
| JP | 2000-026127 | 1/2000 |
| JP | 2000-36381 | 2/2000 |
| JP | 2007-516611 | 6/2007 |
| JP | 2007-194075 | 8/2007 |
| JP | 2008-133174 | 6/2008 |
| JP | 2009-067632 | 4/2009 |
| JP | 2009-146625 | 7/2009 |
| KR | 10-1999-0022312 | 3/1999 |
| WO | 97/36836 | 10/1997 |
| WO | 2005/050751 | 6/2005 |

OTHER PUBLICATIONS

Korean Office Action issued May 24, 2017 in corresponding Korean Patent Application No. 10-2012-7011507 with Machine Translation.
International Search Report dated May 10, 2011 in corresponding International (PCT) Application No. PCT/JP2011/052617.
International Preliminary Report on Patentability and Written Opinion of the International Searching Authority dated Sep. 27, 2012 in International (PCT) Application No. PCT/JP2011/052617.

* cited by examiner

*Primary Examiner* — Jennifer Chriss
*Assistant Examiner* — Lawrence Ferguson
(74) *Attorney, Agent, or Firm* — Wenderoth, Lind & Ponack, L.L.P.

(57) ABSTRACT

A sealing material is formed of a glass ribbon having a thickness of 1 to 100 μm. The sealing material has both surfaces and side surfaces formed into fire-polished surfaces.

6 Claims, 6 Drawing Sheets

SEALING MATERIAL AND SEALING METHOD USING THE SAME

TECHNICAL FIELD

The present invention relates to a sealing material used for a lighting device, a solar cell device, a display device, a medical device, an analysis device, or the like, and to a sealing method using the same.

BACKGROUND ART

In recent years, in consideration of environment and the like, devices such as an OLED lighting, a solar cell, an OLED display, a medical device, and an analysis device are being actively developed.

In the above-mentioned devices, it is necessary to seal a plurality of members such as glass substrates with a certain clearance, in order to seal an element or liquid between the plurality of members. As a sealing material, a resin or adhesive containing an organic compound, or glass powder (glass frit) is used (see Patent Documents 1 and 2 described below).

Further, regarding these kinds of devices, an attempt is made to produce a flexible device capable of being bent or wound by using a glass substrate having a thickness of 200 µm or less and flexibility. Specifically, an attempt is made to produce an OLED display that is portable and capable of being bent or wound, and a solar cell or an OLED lighting capable of being mounted onto a surface of an object having a curved surface such as a vehicle body surface of an automobile, and a roof, pillar, exterior wall of a building.

PRIOR ART DOCUMENT

Patent Document

Patent Document 1: JP 2000-36381 A
Patent Document 2: JP 2007-516611 A

SUMMARY OF THE INVENTION

Problems to be Solved by the Invention

However, when the resin or adhesive containing the organic compound is used as the sealing material for the above-mentioned devices, gas such as water vapor cannot be completely shielded, and hence there is a fear in that long-term use may deteriorate functions of the devices.

Further, when the glass frit is used as the sealing material, gas can be shielded. However, in a case where the glass frit is used for the flexible device, there is a possibility in that a crack occurs in a sealed portion at the time of bending and winding so that air tightness is deteriorated.

Still further, in a case where two glass substrates are sealed to each other using the resin or adhesive containing the organic compound, or the glass frit, there is required a step of applying the sealing material at predetermined locations of the glass substrates, and hence there are problems in that workability is poor and a sealing shape after heating is not stable due to an application state, a heating condition, and the like of the sealing material.

The present invention has been made in order to solve the above-mentioned problems of prior arts, and it is an object of the present invention to provide a sealing material which is excellent in flexibility and gas-barrier property of shielding gas such as water vapor, and also has a function as a spacer member for retaining two glass substrates with a certain clearance.

Means for Solving the Problems

The present invention relates to a sealing material, which is formed of a glass ribbon having a thickness of 1 to 100 µm.

It is preferred that both surfaces of the glass ribbon be formed into fire-polished surfaces.

It is preferred that a thickness deviation of the glass ribbon be within 20% of the thickness of the glass ribbon.

It is preferred that an aspect ratio of width to thickness of the glass ribbon be 25 to 2000.

It is preferred that the glass ribbon contain a transition element.

It is preferred that the glass ribbon have a surface subjected to film forming treatment.

Further, the present invention relates to a lighting device, comprising a member using the sealing material as described above.

Further, the present invention relates to a solar cell device, comprising a member using the sealing material as described above.

Further, the present invention relates to a display device, comprising a member using the sealing material as described above.

Further, the present invention relates to a sealing method, comprising the steps of arranging a sealing material which is formed of a glass ribbon having a thickness of 1 to 100 µm at a predetermined location of an adherend, and heating the sealing material to adhere the adherend and the sealing material to each other.

In the above-mentioned configuration, the adherend and the sealing material can be adhered to each other by heating contact surfaces of the adherend and the sealing material.

The adherend and the sealing material may be adhered to each other by heating a part of the contact surfaces of the adherend and the sealing material.

In the above-mentioned configuration, it is preferred that the adherend be a glass substrate.

It is preferred that the glass substrate have a thickness of 10 to 200 µm.

It is preferred that both surfaces of the glass substrate be formed into fire-polished surfaces.

It is preferred that the glass substrate contain a transition element.

In the above-mentioned configuration, the sealing material may be heated by irradiating light having a wavelength which is absorbed by the transition element or an ion of the transition element in the glass ribbon.

The glass ribbon may have a surface subjected to film forming treatment.

In the above-mentioned configuration, the contact surface of the sealing material may be heated by irradiating light having a wavelength which is absorbed by a film formed on the surface of the glass ribbon.

In the above-mentioned configuration, the sealing material may be heated by a laser.

Effect of the Invention

According to the present invention, the sealing material is formed of the glass ribbon having the thickness of 1 to 100 µm, i.e., a strip-like thin glass sheet, and hence is excellent in gas-barrier property of shielding gas. When components of the device are sealed using such the sealing material, it is possible to suppress deterioration of an element or a solution in the device for a long period of time. Further, the sealing material of the present invention has flexibility, and hence can be used as the sealing material for the flexible device. Accordingly, a crack is less likely to occur at the sealed portion at the time of bending and winding, and air tightness is not deteriorated.

Further, in recent years, it is demanded to air-tightly seal the glass substrates to each other while keeping a clearance of 100 μm or less. When using the sealing material according to the present invention, it is possible to effect air-tight sealing with the clearance of 100 μm or less with good accuracy, and to omit an applying step and a drying step that are conventionally performed, and hence productivity is also improved. In particular, it is preferred that the sealing material formed of the glass ribbon according to the present invention be used for a micro prepared slide used in medical and analytical fields. In this case, the glass ribbon can uniformly keep, as a spacer member, an extremely narrow clearance between two opposing glass sheets, and the two glass sheets are sealed by the glass ribbon. Thus, displacement of the two glass sheets, leakage of liquid to be analyzed, and the like do not occur, and hence reliability is high. In addition, when only two opposing sides of the rectangular micro prepared slide are sealed by the glass ribbon, it is possible to easily inject the liquid to be analyzed between the two glass sheets from opening end surfaces of two unsealed sides using a capillary phenomenon.

Further, in consideration of productivity of the glass ribbon, a handling property as the sealing material, and the like, it is suitable that the glass ribbon has a width of 1 to 5 mm and a length of 1 to 100 m. Note that, the sealing material of the present invention is formed of the glass ribbon having the thickness of 1 to 100 μm, and hence can be appropriately cut into a necessary length for use.

For the sealing material of the present invention, a redraw method is preferable, wherein a glass preform is manufactured and then the glass preform is heated to down-draw into a ribbon shape. By appropriately adjusting a size and a material of the glass preform, a temperature condition during down-drawing, a drawing rate, and the like, the sealing material can be formed into a desired dimension.

When both surfaces (front surface and back surface) of the glass ribbon are formed into fire-polished surfaces, in comparison with a glass ribbon having a surface subjected to processing such as polishing, the surface is uniformly softened when being heated as the sealing material, and hence a satisfactory sealing state is obtained. Further, a fracture, a chip, a crack, and the like are not present in both the surfaces, and hence it is possible to effectively prevent breakage of the glass ribbon. In particular, when side surfaces of the glass ribbon are also formed into the fire-polished surfaces to have convex curved surface portions, it is possible to prevent stress concentration on four corner portions in cross-sectional view during bending the glass ribbon.

When the thickness deviation of the glass ribbon is within 20% of its thickness, highly accurate sealing is possible. Specifically, in a case of sealing the two glass substrates while keeping a certain clearance, it is possible to effect sealing with a desired clearance with good accuracy.

When the aspect ratio of width to thickness of the glass ribbon is 25 to 2000, it is possible to obtain a suitable shape for the sealing material particularly for the device such as an OLED lighting, a solar cell device, or an OLED display.

When the glass ribbon contains the transition element, by irradiating light having a wavelength which is absorbed by the transition element or the ion of the transition element onto the sealing material, easy adhering is possible.

When the glass ribbon has the surface subjected to the film forming treatment, by irradiating light, having a wavelength which is absorbed by the film component formed on the surface of the glass ribbon, onto the contact surface of the sealing material, easy adhering is possible.

According to the lighting device of the present invention including the member using the above-mentioned sealing material, it is possible to produce, for example, an OLED lighting capable of preventing deterioration of an element or liquid for a long period of time.

According to the solar cell device of the present invention including the member using the above-mentioned sealing material, it is possible to produce, for example, a dye-sensitized solar cell capable of preventing deterioration of an element or liquid for a long period of time.

According to the display device of the present invention including the member using the above-mentioned sealing material, it is possible to produce, for example, an OLED display capable of preventing deterioration of an element or liquid for a long period of time.

Further, the present invention comprises the steps of arranging a sealing material which is formed of a glass ribbon having a thickness of 1 to 100 μm at a predetermined location of an adherend, and heating the sealing material to adhere the adherend and the sealing material to each other. Thus, it is possible to omit the applying step that is conventionally performed, and workability for sealing is improved.

The adherend and the sealing material are adhered to each other by heating the contact surfaces of the adherend and the sealing material. Thus, satisfactory sealing is possible for a short period of time.

Further, the adherend and the sealing material are adhered to each other by heating a part of the contact surfaces of the adherend and the sealing material. Thus, satisfactory sealing for a short period of time is possible.

When the adherend is the glass substrate, it is possible to heat the glass substrate and the sealing material at the same time by a laser or the like.

When the glass substrate has the thickness of 10 to 200 μm, it is possible to produce the flexible device.

When both the surfaces of the glass substrate are formed into the fire-polished surfaces, an adhesion property with the sealing material is improved, which allows easy adhering. Both the surfaces can be formed into the fire-polished surfaces by adopting an overflow down-draw method or a redraw method as a forming method for the glass substrate.

When the glass ribbon contains the transition element, by irradiating light, having a wavelength which is absorbed by the transition element or the ion of the transition element, onto the sealing material, easy adhering is possible.

When the sealing material is heated by irradiating light having a wavelength which is absorbed by the transition element or the ion of the transition element in the glass ribbon, easy adhering for a short period of time is possible.

When the glass ribbon has the surface subjected to the film forming treatment, by irradiating light, having a wavelength which is absorbed by the film component formed on the surface of the glass ribbon, onto the contact surface of the sealing material, easy adhering is possible.

When the contact surface of the sealing material is heated by irradiating light having a wavelength which is absorbed by the film component formed on the surface of the glass ribbon, easy adhering for a short period of time is possible.

When the sealing material is heated by a laser, it is possible to effect sealing for a short period of time while keeping the shape of the sealing material.

BRIEF DESCRIPTION OF THE DRAWINGS

FIG. 1 (b) is a perspective view of a part of the sealing material according to the present invention.

FIG. 2 (a) is a perspective view showing a state in which the sealing material according to the present invention is wound around a bobbin.

FIG. 2 (b) is a front view showing a state in which the sealing material according to the present invention is wound around the bobbin.

FIG. 5(a) is a plan view showing a device in which an electrolyte is sealed in a clearance between two transparent glass substrates using the sealing material according to the present invention.

FIG. 5 (b) is a cross-sectional view taken along the line A-A of FIG. 5(a).

DETAILED DESCRIPTION OF THE INVENTION

In the following, a sealing material according to a preferred embodiment of the present invention is described with reference to the drawings.

Figure 1A:
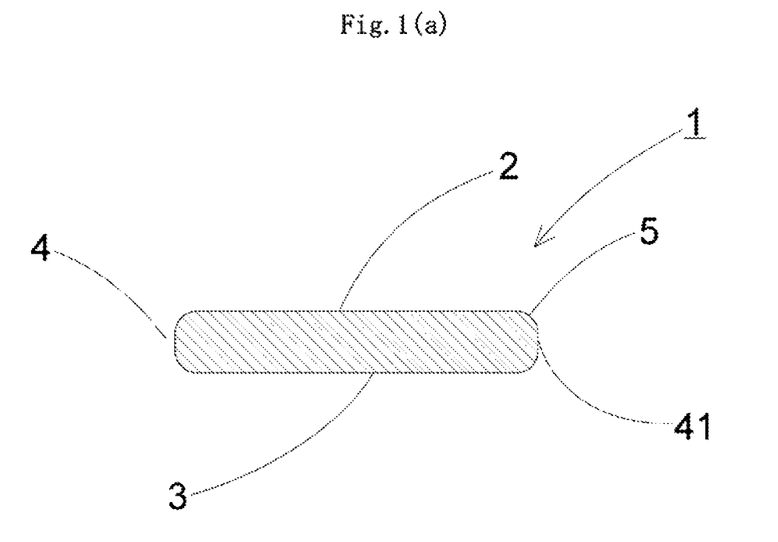
FIG. 1(a) is a sectional view of a sealing material according to the present invention.
Figure 1B:
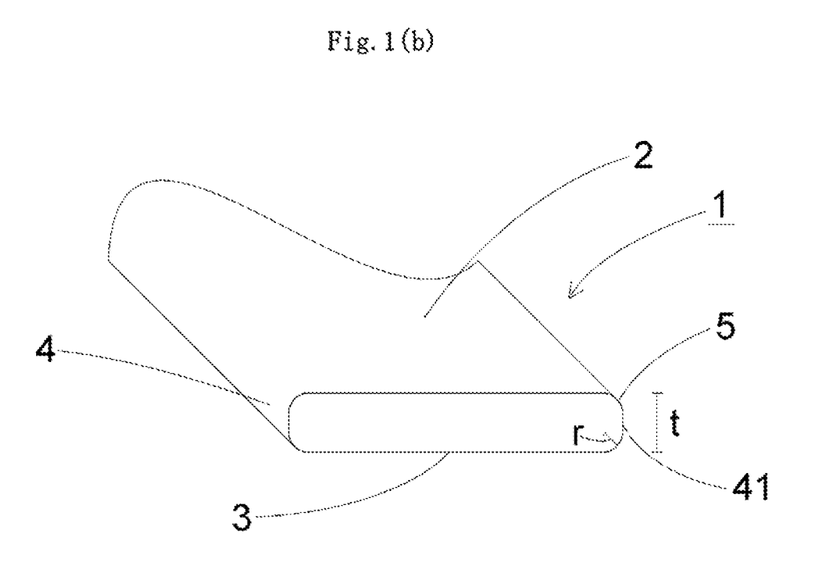

As shown in FIGS. 1(a) and (b), a sealing material (1) according to the present invention is formed of a glass ribbon having a thickness of 1 to 100 μm, and has both surfaces (2) and (3) and side surfaces (4) that are formed into fire-polished surfaces.

As a material of the glass ribbon, any material may be used as long as the material is glass which can be subjected to down-drawing, such as silicate glass, alkali-free glass, soda glass, borosilicate glass, aluminosilicate glass, or silica glass. In particular, the use of alkali-free glass has the following advantage. That is, the alkali-free glass can be used as the sealing material for a device including an element that is degraded by an alkaline component.

It is preferred that the glass ribbon contain 0.01 to 30 mass % of an ion of a transition metal. When the glass ribbon contains the transition element, by irradiating light having a wavelength which is absorbed by the transition element or the ion of transition metal onto the sealing material (1), it is possible to effectively heat the sealing material (1). With this, only the sealing material (1) can be selectively heated and softened, to thereby be able to seal an adherend such as a glass substrate. Heating of a contact member is suppressed, and hence, even when the contact member contains a portion that is prone to deteriorate by the heating, it is possible to effect sealing without deteriorating the portion.

As the transition element, elements in groups 3 to 11 of the periodic table may be used, but preferably elements in the first series (fourth period) or elements in the second series (fifth period) are suitable, and more preferably elements in the first series are suitable, in particular, Fe, Co, Ni, Cu are most preferred. Further, a light source of irradiation light is not particularly limited as long as the light source emits the light of the wavelength absorbed by the transition element or the ion of the transition element to be used, but an infrared lamp, a visible light lamp, a laser (femtosecond laser, YAG laser, or the like), a light-emitting diode (LED), or the like may be used.

It is preferred that a surface of the glass ribbon be subjected to film forming treatment. By irradiating, onto the contact surface of the sealing material (1), light having a wavelength which is absorbed by a film component formed on the surface of the glass ribbon, the contact surface of the sealing material (1) can be easily heated. With this, it is possible to effectively heat an interface between the adherend and the sealing material (1), and to easily adhere the sealing material (1) and the adherend to each other for a short period of time. Further, a glass surface of the glass ribbon as the sealing material is partially exposed by partial masking treatment or the like at the time of film formation, with the result that softening of the surface of the glass ribbon can also contribute to fusion-adhering with the adherend. Of both the surfaces (2) and (3) of the glass ribbon, only any one of the surfaces may be subjected to the film forming treatment, but it is more preferred that both the surfaces (2) and (3) of the glass ribbon be subjected to the film forming treatment.

In a configuration of performing the film forming treatment on the surface of the glass ribbon, it is preferred that the side surfaces (4) of the glass ribbon, in particular, convex curved surface portions (5) be not subjected to the film forming treatment. With this, even when light having a wavelength which is absorbed by the film component is irradiated onto the sealing material (1), only both the surfaces (2) and (3) of the sealing material can be selectively heated, but the convex curved surface portions (5) are not heated, with the result that it is possible to adhere the sealing material (1) and the adherend to each other while the sealing material (1) keeps a form of convex curved surface. The sealing material (1) keeps the form of convex curved surface, and hence, even when bending a flexible device (lighting, solar cell, display device, or the like) sealed by the sealing material (1), it is possible to prevent stress concentration on the side surfaces of the sealing material (1), and to prevent breakage of the sealing material (1).

As the film component to be formed on the surface of the glass ribbon, preferred is an Si film, a Ge film, a metal film (Ni, Cr, Ti, Ta, or the like), an oxygen deficient film (TiO(2-x)), or the like, each of which has an optical absorption band. Further, the light source of irradiation light onto the film-formed surface of the seal material (1) is not particularly limited as long as the light source emits light having such a wavelength that the film component formed on the surface of the glass ribbon can absorb the light. An infrared lamp, a visible light lamp, a laser (a femtosecond laser, a YAG laser, or the like), a light-emitting diode (LED), or the like may be used.

As a method of forming the film on the surface of the glass ribbon, a well-known method such as a sputtering method, a CVD method, a PVD method, a resistance heating method, or an ion plating method can be employed.

It is preferred that a difference in coefficient of thermal expansion between the glass ribbon and the adherend be small. However, the thickness of the glass ribbon is small, and hence it is possible to allow a certain amount of difference in coefficient of thermal expansion between the glass ribbon and the adherend, and to effect adhering or sealing when the difference falls within $30 \times 10^{-7}/°$ C. (over a temperature range of 0 to 300° C.). It is more preferred that the difference in coefficient of thermal expansion fall within $20 \times 10^{-7}/°$ C., still more preferably $10 \times 10^{-7}/°$ C.

When the thickness of the glass ribbon is too large, a clearance between the glass substrates is increased more than necessary. Further, in a case of being used for the flexible device, the sealing material (1) is also required to be flexible, and hence it is desired that the thickness of the glass ribbon be as small as possible. However, when the thickness is too small, the glass ribbon is likely to break, which leads to a difficulty in handling. Accordingly, the thickness of the glass ribbon is 100 μm or less, and it is preferred that the thickness of the glass ribbon be 50 μm or less, more preferably 25 μm or less, still more preferably 20 μm or less, and most preferably 10 μm or less. Further, it is preferred that the thickness of the glass ribbon be 1 μm or more, more preferably 5 μm or more.

In order to have a function of serving as a spacer member to ensure a highly accurate clearance, and to prevent tensile stress from locally concentrating on the surface (2) on the outer peripheral side and allow uniform application of the tensile stress at the time of bending, it is preferred that the glass ribbon have a small thickness deviation. Specifically, the thickness deviation falls within preferably 20% of the thickness, more preferably 10%. Note that, the thickness deviation is referred to as a value obtained by measuring five points of a portion including both the surfaces (2) and (3) in a width direction, and dividing a difference between the measured maximum value and the measured minimum value by the average value, the five points being equally spaced in the width direction.

In order to prevent the tensile stress from locally concentrating on the surface (2) on the outer peripheral side in the case of bending the glass ribbon, and to allow uniform application of the tensile stress, it is preferred that both the surfaces (2) and (3) be as flat as possible. Specifically, it is preferred that each of the surfaces (2) and (3) be a high-quality surface having a surface roughness with an Ra value of 0.5 nm or less, more preferably 0.3 nm or less, and most preferably 0.2 nm or less.

It is preferred that an aspect ratio of width to thickness of the glass ribbon be 25 to 2000. With this, a suitable shape as a sealing material particularly for a device such as an OLED lighting, a solar cell device, or an OLED display is obtained. When the aspect ratio is below 25, the sealing material is in a form of a glass rod or a glass fiber, and hence, when the thickness is reduced, a contact area with the adherend is reduced. Meanwhile, when the aspect ratio exceeds 2000, the width is increased, with the result that the sealing material is increased in size as the sealing material more than necessary.

It is preferred that, in the glass ribbon, the side surfaces (4) have the convex curved surface portions (5). With this, when bending the glass ribbon, it is possible to prevent stress from concentrating on four corner portions in cross-sectional view. Further, it is possible to prevent occurrence of a chip and a crack. Therefore, it is possible to obtain the sealing material (1) capable of being bent at a large curvature (in case of being wound around a bobbin or the like having a small diameter, or the like).

It is preferred that the convex curved surface portions (5) of the glass ribbon be fire-polished surfaces. After being formed, the convex curved surface portions (5) are not subjected to a chamfering process such as a grinding process, or a polishing process, and hence a fracture, a chip, a crack, or the like is not present in the convex curved surface portions (5). Thus, it is possible to effectively prevent the glass ribbon from breaking from its side surfaces. Therefore, it is possible to obtain the sealing material (1) capable of being bent at a larger curvature (in the case of being wound around a bobbin or the like having a small diameter, or the like).

In FIGS. 1(a) and (b), each of the convex curved surface portions (5) of the glass ribbon has a shape of an arc of a true circle in cross-sectional view of the glass ribbon. However, not being limited to this shape, the convex curved surface portion (5) may have an ellipse shape in cross-sectional view. In order to uniformly apply tensile stress to the convex curved surface portion (5) when bending the glass ribbon, it is preferred that the convex curved surface portion (5) has a true circle in cross-sectional view. As shown in FIG. 1(b), in a case where the convex curved surface portion (5) has the shape of an arc of a true circle in cross-sectional view, it is preferred that a radius r of the true circle be equal to or smaller than ½ of a thickness t of the glass ribbon. This enables a curvature of the convex curved surface portion (5) to be increased, and hence it is possible to more widely distribute the tensile stress applied on the convex curved surface portion (5). Further, it is preferred that the radius r be equal to or larger than ⅕₀ of the thickness t of the glass ribbon (1). When the radius r is smaller than ⅕₀ of the thickness t of the glass ribbon (1), the curvature of the convex curved surface portion (5) is too small, and hence there is a possibility in that stress concentration occurs to cause breakage when bending the glass ribbon (1) at a large curvature. Further, there is also a possibility in that a chip and a crack are likely to occur in the convex curved surface portion (5).

In cross-sectional view of the glass ribbon, it is preferred that the convex curved surface portion (5) and each of the surfaces (2) and (3) be smoothly continuous with each other, and that the convex curved surface portion (5) and a flat surface portion (41) of each of the side surfaces (4) be smoothly continuous with each other. Specifically, in the convex curved surface portion (5) continuous from each of the surfaces (2) and (3) to the flat surface portion (41) of the side surface (4), the curvature gradually increases from each of the surfaces (2) and (3) to reach a maximum value, and then the curvature gradually decreases toward the side surface (4) to be smoothly continuous with the flat surface portion (41). When the curvature reaches the maximum value, the curvature preferably has the radius r equal to or smaller than ½ of the thickness t of the glass ribbon. With this, it is possible to prevent tensile stress from concentrating on the corner portion, and to bend the sealing material (1) at a larger curvature. If the continuation portion between the convex curved surface portion (5) and each of the surfaces (2) and (3), and between the convex curved surface portion (5) and the flat surface portion (41) of the side surface (4) of the glass ribbon are configured to have an edge, there is a possibility in that tensile stress concentrates on the edge in a case of bending the sealing material (1).

Figures 2A, 2B:
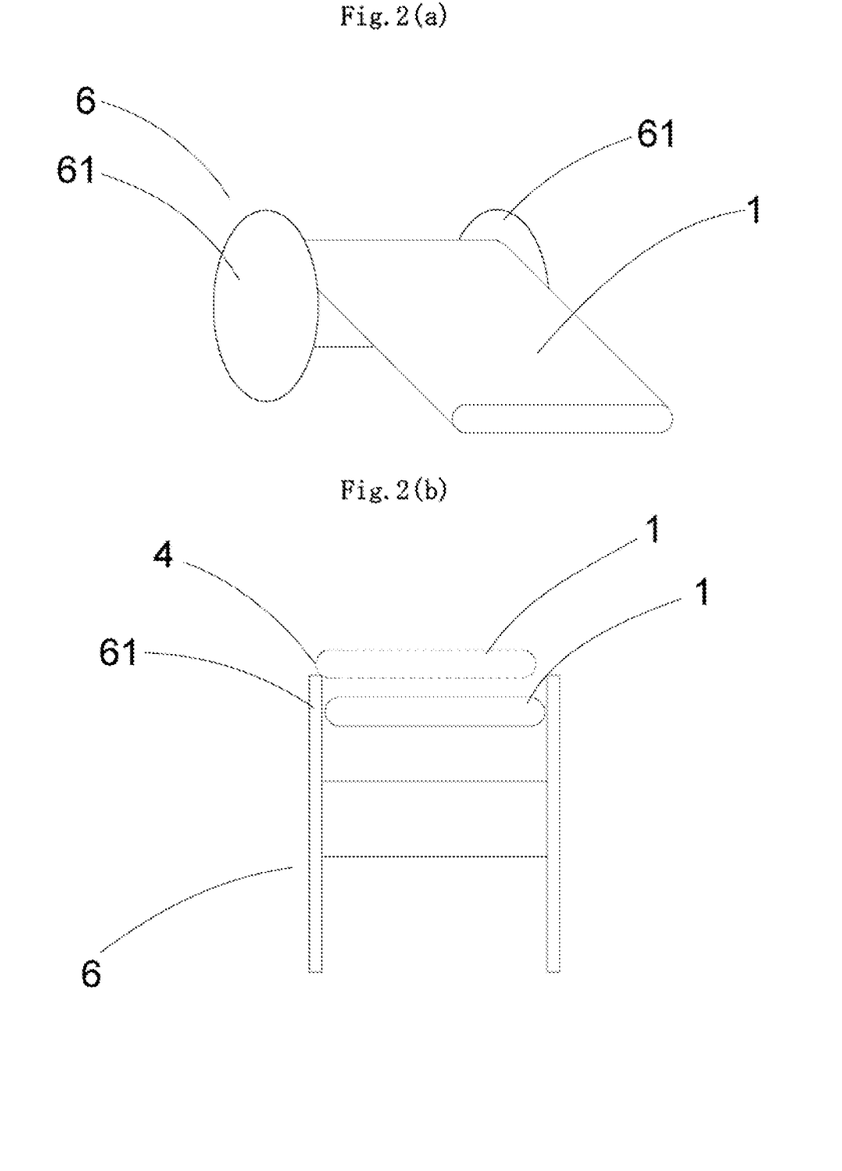

As shown in FIG. 2(a), it is preferred that the sealing material (1) be wound around a bobbin (6) including flanges (61) at both end portions thereof. This can facilitate storage, transportation, handling, and the like of the sealing material (1).

The glass ribbon includes the convex curved surface portions (5) on the side surfaces (4) thereof. Thus, as shown in FIG. 2(b), when the glass ribbon is wound around the bobbin (6), a side end portion of the glass ribbon contacts with the flanges (61) of the bobbin (6) (a state of the glass ribbon indicated by a broken line in FIG. 2(b)), and then the convex curved surface portion (5) on the side surface (4) of the glass ribbon is guided along the flange (61), and thus the glass ribbon is wound around the bobbin (6). Accordingly, winding around the bobbin (6) is facilitated. Further, the convex curved surface portions (5) are guided along the flanges (61), and hence the glass ribbon (1) can be smoothly wound around and unwound from the bobbin (6).

It is preferred that the sealing material (1) according to the present invention be wound in a state of being lapped over a packaging cushion sheet. With this, it is possible to prevent deterioration of surface accuracy of the surfaces, which is caused by rubbing of the surfaces of the sealing material (1) with each other. As the packaging cushion sheet, a foamed resin sheet, a resin film, an inserting paper, a nonwoven fabric, or the like can be used. It is preferred that the packaging cushion sheet be larger in width than the glass ribbon in order to protect the side surfaces (4) of the glass ribbon. Further, it is preferred that the packaging cushion sheet have a width dimension substantially equal to a width dimension between the flanges (61) of the bobbin (6). This can prevent the packaging cushion sheet from slipping between the flanges (61) of the bobbin (6), and hence it is possible to more reliably prevent deterioration of surface accuracy of both the surfaces (2) and (3) and the side surfaces (4) of the glass ribbon (1).

Figure 3:
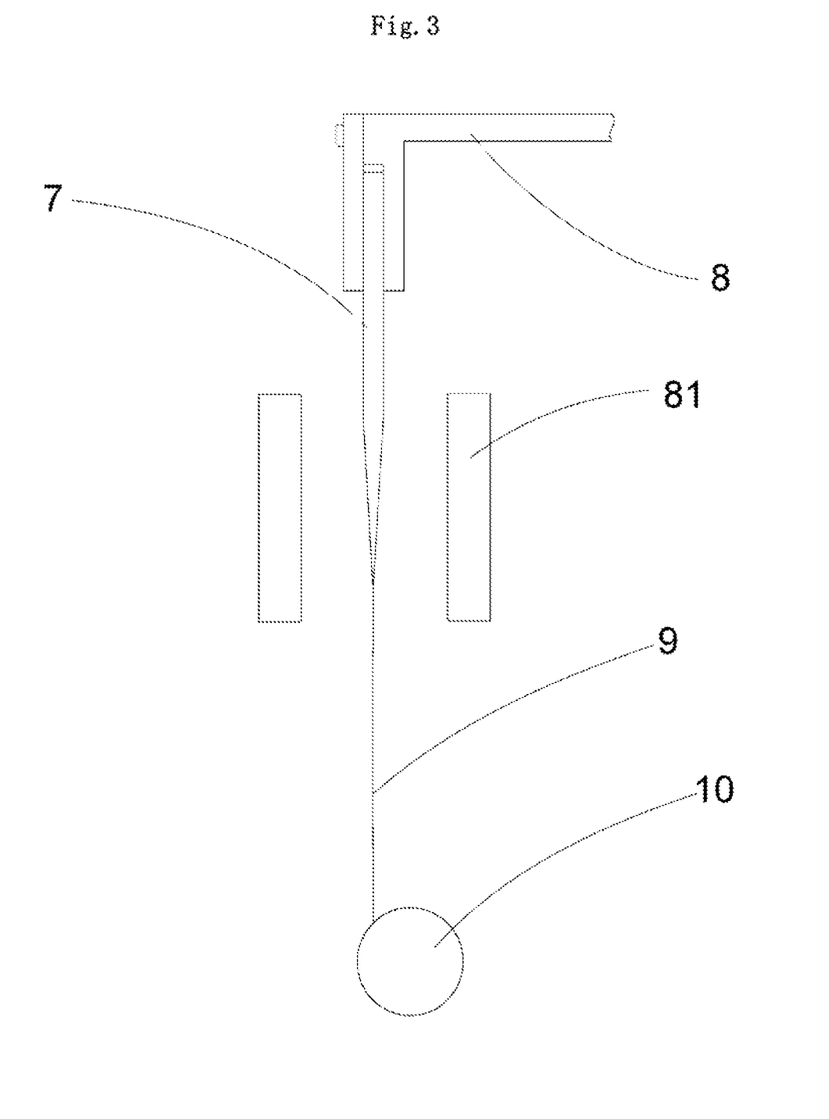
FIG. 3 is an explanatory diagram showing an apparatus for manufacturing a glass ribbon according to the present invention.

FIG. 3 is an explanatory diagram showing a method of manufacturing a sealing material according to the present invention.

When manufacturing the sealing material (1) according to the present invention, first, a glass preform (7) formed of borosilicate glass and adjusted to have a thickness of 2 mm or less is prepared. The glass preform (7) is obtained in such a manner that molten glass supplied from a glass melting furnace (not shown) is formed into a substantially rectangular shape having a predetermined dimension by a well-known forming method such as a roll forming method, a float forming method, an up-draw forming method, or a slot down-draw forming method. In particular, it is preferred that the glass preform be formed by an overflow down-draw method. This is because it is possible to obtain the glass preform (7) having no flaw on the surface and having a high surface quality. When the glass preform (7) has a high surface quality, it is also possible to increase a surface quality of a glass ribbon (9) described below, which is formed by down-drawing, and hence the glass ribbon (9) capable of being wound at a larger curvature can be manufactured.

Side surfaces of the glass preform (7) may remain unprocessed. However, by performing so-called C-chamfering, R-chamfering, or the like on four corners of side surfaces, convex curved surface portions which are formed on side surfaces of the glass ribbon (9) after down-drawing may be appropriately adjusted so as to have a desired shape.

Next, the glass preform (7) is set in a down-drawing apparatus (8), and is down-drawn while being heated under a predetermined condition using a heater (81). As a result, it is possible to obtain the glass ribbon (9) having a thickness of 1 to 100 µm, in which both surfaces and the side surfaces are formed into the fire-polished surfaces and the side surfaces include the convex curved surface portions.

Here, in a case where the thickness of the glass preform exceeds 2 mm, or in a case where the thickness of the glass ribbon (9) exceeds 100 µm, there is a possibility in that an edge portion may be formed, or a side verge portion may be formed in the glass ribbon (9), and hence it is preferred to use glass preform having a small thickness. Specifically, it is preferred that the glass preform have a thickness of 0.5 mm or less, more preferably 0.1 mm or less.

It is preferred that the down-drawing be performed at a temperature at which a viscosity of the glass preform (7) is 6.0 to 9.0 dPa·s. With this, it is possible to obtain a flat glass ribbon having a uniform thickness, in which there are no warpage in the width direction of the glass ribbon, no bending at its both end portions, no thickness deviation, and the like. Meanwhile, in a case where the down-drawing is performed at a temperature at which the viscosity of the glass preform (7) is less than 6.0 dPa·s (at higher temperature), the aspect ratio may largely change, which is not preferred. Further, at a temperature at which the viscosity of the glass preform (7) is more than 9.0 dPa·s (at lower temperature), the viscosity is too high, and hence it is difficult to perform the down-drawing, which is not preferred. In order to manufacture the glass ribbon in which the side surfaces include the convex curved surface portions (5), it is more preferred that the down-drawing be performed at a temperature at which the viscosity of the glass preform (7) is 6.0 to 7.5 dPa·s. In particular, in a case where the drawing is performed under a condition that the thickness of the glass preform (7) is 0.5 mm or less and the viscosity is 6.0 to 7.0 dPa·s so that the thickness of the glass ribbon (9) subjected to the down-drawing is 25 µm or less, the side surfaces are formed into the convex curved surface portions constituted by the fire-polished surfaces, so that the side surfaces (4) do not include flat surface portions (41), which is most preferred. Meanwhile, if avoiding a change in aspect ratio, it is more preferred that the down-drawing be performed at a temperature at which the viscosity of the glass preform (7) is 7.5 to 9.0 dPa·s, although the convex curved surface of the side surface tends to be small. In particular, in a case where the drawing is performed at a temperature at which the viscosity is 8.0 to 9.0 dPa·s, the change in aspect ratio does not substantially occur.

The down-drawing is performed using a winding drum (10). In the well-known down-drawing, a tensile force is applied by sandwiching glass by a pair of rollers. However, when an attempt is made to apply the tensile force by sandwiching the glass ribbon (9) by the pair of rollers, the glass ribbon (9) is too thin, and hence the glass ribbon (9) may break due to pressure applied by the pair of rollers. Further, it is conceivable that tension rollers are arranged in a staggered manner and the glass ribbon (9) is pulled in a zigzag shape (S shape), to thereby apply tension. However, both the surfaces of the glass ribbon (9) are brought into contact with the rollers, which may cause deterioration of surface quality. Therefore, in the manufacturing method of the embodiment, the glass ribbon (9) subjected to the down-drawing is wound directly by the winding drum (10), and thus the tensile force is applied during down-drawing. Regulation of the tensile force (regulation of down-drawing rate) is regulated by winding speed of the winding drum (10). With this, it is possible to obtain the glass ribbon (9) having a high surface quality. Note that, FIG. 3 shows an example of using the winding drum (10) including the flanges, but a winding drum with no flange may be used.

The glass ribbon (9) wound by the winding drum (10) is cut into strips having a predetermined length (predetermined weight). After replacing the winding drum (10), winding of the glass ribbon (9) is restarted. The glass ribbon (9) wound by the winding drum (10) may be packaged and shipped as it is. Alternatively, the glass ribbon (9) may be shipped in small portions by rewinding around the bobbins. Further, instead of using the winding drum (10), the glass ribbon (9) may be wound directly around the bobbin.

Figure 4:
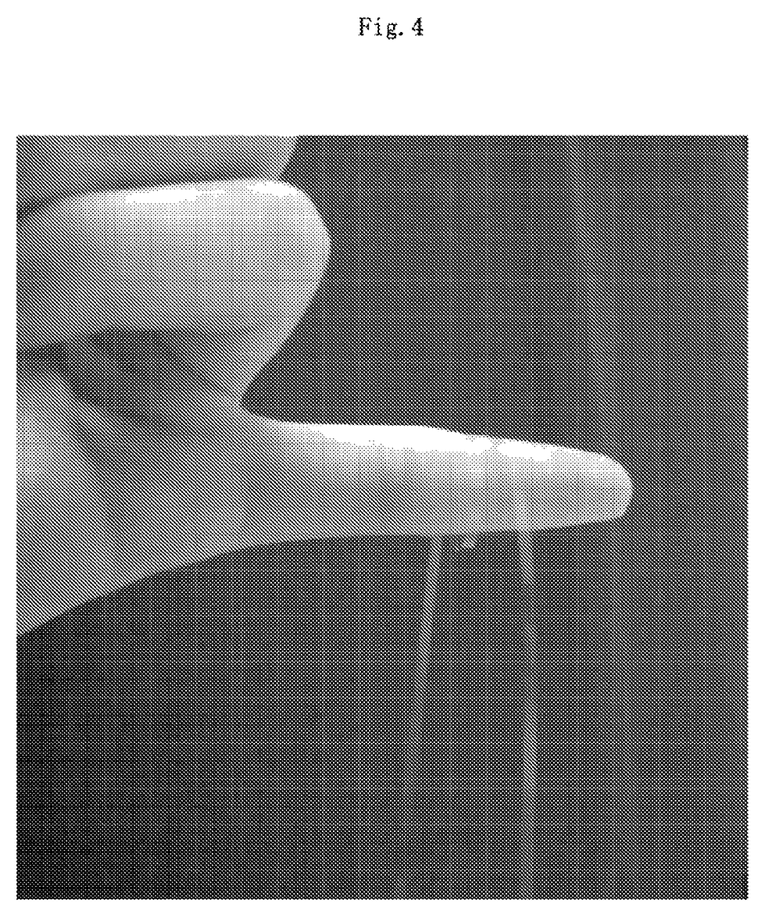
FIG. 4 is a photo showing a state in which the glass ribbon according to the present invention is wound around a finger.

As shown in FIG. 4, the sealing material (1) according to the present invention, which is obtained by the above-mentioned manufacturing method, does not break even if being wound around a finger of a human, and hence can be wound at a large curvature (around a bobbin having a small diameter or the like).

Figures 5A, 5B:
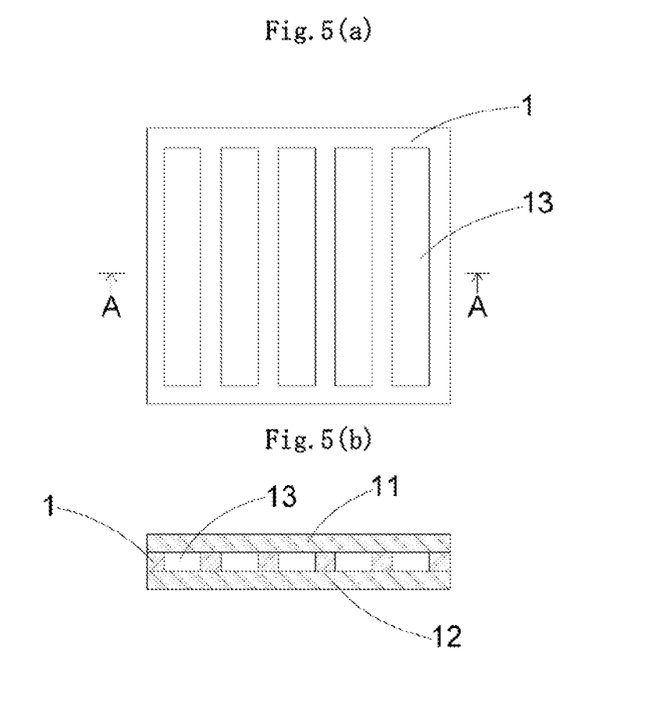
Figure 6:
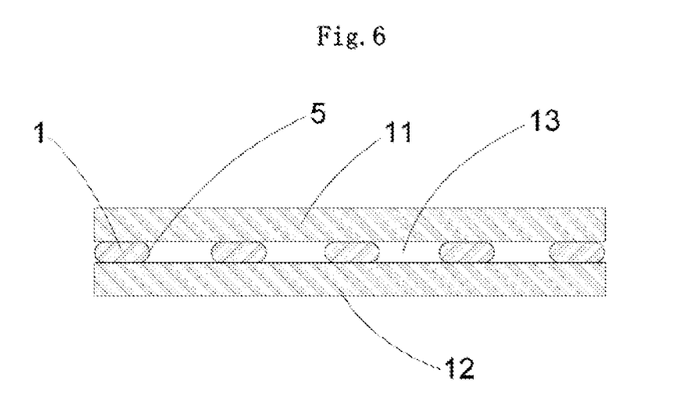
FIG. 6 is a cross-sectional view showing the device in which the electrolyte is sealed in the clearance between the two transparent glass substrates using the sealing material according to the present invention in a state of keeping convex curved surface portions.

FIGS. 5(a) and (b) are schematic views showing a device in which an electrolyte (13) is sealed in a clearance between two transparent glass substrates (11) and (12) using the sealing material (1) according to the present invention. The sealing material (1) is arranged at a predetermined location of the clearance between the two glass substrates (11) and (12), and then the sealing material (1) is heated so that the glass substrates (11) and (12) and the sealing material (1) can be adhered to each other. A method of heating the sealing material is not particularly limited, but a laser such as a $CO_2$ laser, a femtosecond laser, or a YAG laser, an infrared lamp, a visible light lamp, a light-emitting diode (LED), or the like can be used. At this time, only the sealing material (1) may be heated from the side surface of the device using the $CO_2$ laser, or the sealing material (1) and the glass substrate (11) may be heated at the same time by heating the entire side surface of the device. Further, the contact surfaces of the sealing material (1) and the glass substrates (11) and (12) may be heated using the femtosecond laser. Alternatively, if ensuring air tightness is ensured, parts of the contact surfaces of the sealing material (1) and the glass substrates (11) and (12) may be heated using the femtosecond laser. In particular, in a case where adhering interfaces between the glass substrates (11) and (12) and the sealing material (1) are selectively irradiated from a plan direction using the femtosecond laser, the glass substrates (11) and (12) are sealingly adhered to each other under a state in which the convex curved surface portions (4) of the sealing material (1) are maintained, as shown in FIG. 6, which is preferred. When the thicknesses of the transparent glass substrates (11) and (12) are set to 10 to 200 μm, the flexible device is obtained. The embodiment of sealing the electrolyte is described above, but a lighting device, a solar cell device, or a display device can be produced by appropriately changing the electrolyte with an element or the like.

In a case where the sealing material (1) is formed of the glass ribbon containing the transition element, by irradiating light having a wavelength which is absorbed by the transition element or the ion of transition element, only the sealing material (1) can be heated, with the result that it is possible to adhere the adherend through the glass ribbon. In addition, when applying the sealing material formed of glass powder at contact portions of the sealing materials (1), more reliable air-tight sealing is obtained, which is preferred.

In a case where the sealing material (1) is formed of the glass ribbon subjected to the film forming treatment, by irradiating light having a wavelength which is absorbed by the film component, the contact surface of the sealing material (1) can be heated. With this, it is possible to effectively heat an interface between the adherend and the sealing material (1), and to easily adhere the adherend and the sealing material to each other for a short period of time.

EXAMPLES

In the following, detailed description is made of the sealing material of the present invention based on examples, but the present invention is not limited to the examples.

Example 1

As glass preform, a formed body (width: 50 mm, thickness: 0.3 mm) which is called BDA (softening point: 740° C.) and manufactured by Nippon Electric Glass Co., Ltd was prepared.

The glass preform was set in the down-drawing apparatus, loaded at a rate of 6 mm/min from a supply port of a forming furnace that is kept at a temperature of 785° C. (at which the viscosity of the glass preform is 6.7 dPa·s), and then drawn from a drawing port at a rate of 1350 mm/min by being wound around the winding drum. As a result, a glass ribbon having a width of 3.0 mm and a thickness of 22 μm (aspect ratio: 135) was obtained.

Using a thickness measuring apparatus (called NEXIV and manufactured by Nikon Corporation), the thickness of the glass ribbon (width: 3.0 mm) was measured at five points that are equally spaced in the width direction (five points in total are both end portions, positions respectively away from a right end portion and a left end portion by 0.75 mm, and a center (position away from both the end portions by 1.5 mm)). The measured thickness was 21.5 μm to 22.0 μm, and the thickness deviation was 0.5 μm (about 2% of the thickness).

A sealing material of the glass ribbon thus obtained was arranged in a peripheral clearance between two glass substrates (glass sheets formed of BDA having a thickness of 1.1 mm), and then the entire side surfaces were scanned and heated, using a $CO_2$ laser under the condition that a laser spot diameter was set to about 2 mm. As a result, a satisfactory air-tight sealing with the clearance of 20 μm was able to be obtained.

Example 2

As glass preform, a formed body (width: 50 mm, thickness: 0.3 mm) which is called BDA (softening point: 740° C.) and manufactured by Nippon Electric Glass Co., Ltd was prepared.

The glass preform was set in the down-drawing apparatus, loaded at a rate of 4 mm/min from a supply port of a forming furnace that is kept at a temperature of 785° C. (at which the viscosity of the glass preform is 6.7 dPa·s), and then drawn from a drawing port at a rate of 900 mm/min by being wound around the winding drum. As a result, a glass ribbon having a width of 3.3 mm and a thickness of 20 μm (aspect ratio: 167) was obtained.

Using a thickness measuring apparatus (called NEXIV and manufactured by Nikon Corporation), the thickness of the glass ribbon (width: 3.3 mm) was measured at five points that are equally spaced in the width direction (five points in total are both end portions, positions respectively away from a right end portion and a left end portion by 0.83 mm, and a center (position away from both the end portions by 1.65 mm)). The measured thickness was 20.20 μm to 21.00 μm, and the thickness deviation was 0.8 μm (about 4% of the thickness). In order to cancel a change that the aspect ratio becomes small, correction of temperature distribution in a forming furnace and correction of down-drawing rate were performed, so that an effect of laterally stretching in a process of down-drawing was given. As a result, a center portion was thinned.

A sealing material of the glass ribbon thus obtained was arranged in a peripheral clearance between two glass substrates (glass sheets formed of BDA having a thickness of 1.1 mm), and then the contact surfaces of the sealing material and each of the glass substrates is heated, using a femtosecond laser. As a result, a satisfactory air-tight sealing with the clearance of 20 μm was able to be obtained.

Example 3

As glass preform, a formed body (width: 50 mm, thickness: 0.2 mm) which is called BDA (softening point: 740° C.) and manufactured by Nippon Electric Glass Co., Ltd was prepared.

The glass preform was set in the down-drawing apparatus, loaded at a rate of 8 mm/min from a supply port of a forming furnace that is kept at a temperature of 725° C. (at which the viscosity of the glass preform is 8.0 dPa·s), and then drawn from a drawing port at a rate of 800 mm/min by being wound around the winding drum. As a result, a glass ribbon having a width of 5.0 mm and a thickness of 20 μm (aspect ratio: 250) was obtained.

A sealing material of the glass ribbon thus obtained was arranged in a peripheral clearance between two glass substrates (glass sheets formed of BDA having a thickness of 1.1 mm), and then the contact surfaces of the sealing material and each of the glass substrates is heated, using a femtosecond laser. As a result, a satisfactory air-tight sealing with the clearance of 20 μm was able to be obtained.

Example 4

Figure 7:
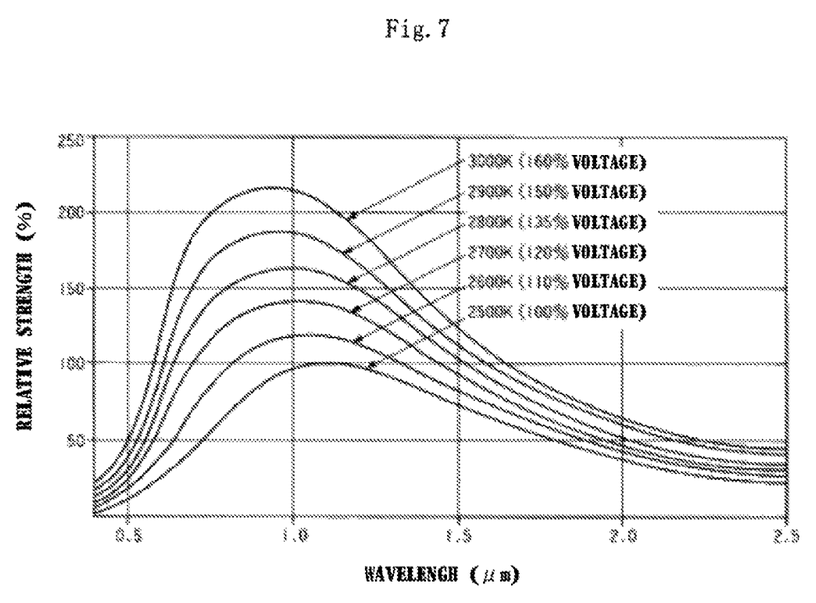
FIG. 7 is a graph showing emission wavelengths of an infrared lamp.

In a similar way to that of Example 2 except that 10 At % of Cu was added as the transition element to the glass preform, a glass ribbon having a width of 3.3 mm and a thickness of 20 μm was obtained. A sealing material of the glass ribbon thus obtained was arranged in a peripheral clearance between two glass substrates (glass sheets formed of BDA having a thickness of 1.1 mm), and light having a color temperature of 3000 K was irradiated using an infrared lamp having an emission wavelength shown in FIG. 7. Accordingly, the glass substrates were not softened, and only the sealing material was selectively heated and softened, with the result of a satisfactory air-tight sealing.

Example 5

As glass preform, a formed body (width: 50 mm, thickness: 0.2 mm) which is called BDA (softening point: 740° C.) and manufactured by Nippon Electric Glass Co., Ltd was prepared.

The glass preform was set in the down-drawing apparatus, loaded at a rate of 8 mm/min from a supply port of a forming furnace that is kept at a temperature of 725° C. (at which the viscosity of the glass preform is 8.0 dPa·s), and then drawn from a drawing port at a rate of 800 mm/min by being wound around the winding drum. As a result, a glass ribbon having a width of 5.0 mm and a thickness of 20 μm (aspect ratio: 250) was obtained.

A nickel film is formed on the glass ribbon thus obtained. The sealing material was arranged in a peripheral clearance between two glass substrates (glass sheets formed of BDA having a thickness of 50 μm), and then the contact surfaces of the sealing material and each of the glass substrates is heated using a YAG laser. As a result, a satisfactory air-tight sealing with the clearance of 20 μm was able to be obtained.

INDUSTRIAL APPLICABILITY

The sealing material according to the present invention is suitable for devices such as an organic light-emitting diode (OLED) lighting, a solar cell, an OLED display, a medical device, and an analysis device.

REFERENCE SIGNS LIST 1 sealing material
2, 3 both surfaces of glass ribbon
4 side surface of glass ribbon
5 convex curved surface portion of glass ribbon
6 bobbin
7 glass preform
8 down-drawing apparatus
9 glass ribbon
10 winding drum
11, 12 glass substrate
13 electrolyte

The invention claimed is:

1. A flexible device comprising:
a plurality of glass substrates;
a sealing material, the sealing material being interposed between the glass substrates to seal a space between the glass substrates; and
one of an electrolyte, an element of a lighting device, an element of a solar cell device and an element of a display device sealed into the space,
wherein the sealing material is formed of a glass ribbon having a thickness of 1 to 100 μm, the sealing material having plain surfaces opposed to each other and side surfaces opposed to each other, each of the side surfaces comprising convex curved surface portions at corner portions that are continuous with the plain surfaces, a thickness deviation of the sealing material being within 20% of the thickness of the sealing material,
wherein each of the plain surfaces of the sealing material adheres to one of the glass substrates by thermal adhesion, and each of the side surfaces of the sealing material maintains the form of the convex curved surface portions,
wherein the sealing material has a film on at least one of the plain surfaces for absorbing a light having a predetermined wavelength, and
wherein the side surface of the sealing material are free of formation of the film.

2. The flexible device according to claim 1, wherein each of the glass substrates has a thickness of 10 to 200 μm.

3. The flexible device according to claim 1, wherein each the side surfaces including the convex curved surface portions is a fire-polished surface.

4. The flexible device according to claim1, wherein each of the plain surfaces is a fire-polished surface having a surface roughness Ra or 0.5 nm or less.

5. The flexible device according to claim 1, wherein the sealing material has an aspect ratio of 25 to 2000 of width to thickness of the sealing material.

6. The flexible device according to claim 1, wherein the sealing material contains a transition element.

* * * * *